(12) United States Patent
Huebl et al.

(10) Patent No.: US 8,943,460 B2
(45) Date of Patent: Jan. 27, 2015

(54) CONTROL UNIT AND METHOD FOR DESIGNING A CIRCUIT BOARD OF A CONTROL UNIT

(75) Inventors: Jochen Huebl, Schwieberdingen (DE); Michael Keicher, Neckarsulm (DE)

(73) Assignee: Robert Bosch GmbH, Stuttgart (DE)

( * ) Notice: Subject to any disclaimer, the term of this patent is extended or adjusted under 35 U.S.C. 154(b) by 22 days.

(21) Appl. No.: 13/820,561

(22) PCT Filed: Jul. 12, 2011

(86) PCT No.: PCT/EP2011/061821
§ 371 (c)(1),
(2), (4) Date: May 13, 2013

(87) PCT Pub. No.: WO2012/031798
PCT Pub. Date: Mar. 15, 2012

(65) Prior Publication Data
US 2013/0223024 A1    Aug. 29, 2013

(30) Foreign Application Priority Data

Sep. 10, 2010  (DE) .......................... 10 2010 040 558

(51) Int. Cl.
*G06F 17/50* (2006.01)
*H05K 1/02* (2006.01)
*H05K 9/00* (2006.01)

(52) U.S. Cl.
CPC ............ *H05K 1/0213* (2013.01); *H05K 9/0067* (2013.01); *G06F 17/5072* (2013.01); *H05K 1/02* (2013.01); *Y02T 10/82* (2013.01)
USPC .......................................... 716/137; 716/139

(58) Field of Classification Search
CPC ................................. G06F 17/50; G06F 15/04
USPC ..................................................... 716/137, 139
See application file for complete search history.

(56) References Cited

U.S. PATENT DOCUMENTS

| 8,410,636 B2 * | 4/2013 | Kurs et al. ..................... 307/104 |
| 2006/0087821 A1 | 4/2006 | Makino et al. |

FOREIGN PATENT DOCUMENTS

| DE | 31 08 546 | 9/1982 |
| EP | 0 998 176 | 5/2000 |
| JP | 2007-214061 | 8/2007 |

OTHER PUBLICATIONS

International Search Report, dated Nov. 30, 2011, issued in corresponding PCT/EP2011/061821.

*Primary Examiner* — Thuan Do
(74) *Attorney, Agent, or Firm* — Kenyon & Kenyon LLP

(57) ABSTRACT

A control unit, e.g., for a motor vehicle, includes a circuit board, a high-impedance circuit component situated on the circuit board and having an impedance of 1 kΩ or higher in relation to ground of the control unit, and at least one conductive protection element electrically connected to ground and situated adjacent to the high-impedance circuit component. The protection element has a height within a protective distance from the high-impedance circuit component that is at least equal to the protective distance. A method for designing a circuit board of a control unit, and a computer program product for executing the method, include the steps of specifying a position of the high-impedance circuit component, and specifying a position of the protection element such that the protection element has a height within a protective distance from the high-impedance circuit component that is at least equal to the protective distance.

16 Claims, 4 Drawing Sheets

CONTROL UNIT AND METHOD FOR DESIGNING A CIRCUIT BOARD OF A CONTROL UNIT

CROSS REFERENCE TO RELATED APPLICATIONS

The present application is the national stage entry of International Patent Application No. PCT/EP2011/061821, filed on Jul. 12, 2011, which claims priority to Application No. DE 10 2010 040 558.2, filed in the Federal Republic of Germany on Sep. 10, 2010.

FIELD OF INVENTION

The present invention relates to a control unit, especially for a motor vehicle; it also relates to a method for designing a circuit board of a control unit and to a computer program product for implementing the method.

BACKGROUND INFORMATION

Modern motor vehicles include a multitude of electronic control units, which are installed at different locations in order to assume control or regulation functions. Control units are also used as embedded systems for the control and regulation of machinery, plants and other technical processes. In order to allow a safe operation of a control unit in installation locations where discharges of static electricity (ESD) and other potentially interfering electromagnetic effects are to be expected, adequate electromagnetic compatibility (EMC) of the control unit must be ensured.

Industry standards such as ISO 10605:2008 prescribe specific test methods by which the electromagnetic compatibility of a control unit must be checked, in particular with regard to electrostatic discharges. For this purpose, the running control unit is selectively exposed to the effects of an air discharge in close proximity to its housing, and it is monitored whether malfunctions arise in the electronics of the control unit. The mechanism that leads to the malfunction in the electronics system is that the high electrostatic field affects the voltage level of high Ohmic circuit components (e.g., oscillator circuits, inputs of analog-digital converters and open-circuited pins on ICs with weak pullup sources such as test pins, programming pins, sensors). If the voltage level of a circuit experiencing such interference is outside its function range, the electronic system may malfunction.

FIG. 5 shows a cross-sectional view of a conventional control unit 100 for a motor vehicle, which is mounted on a test device 500, while a test for electromagnetic interference is implemented during electrostatic discharges according to ISO 10605:2008, the test being shown in simplified form. Control unit 100 has a housing 101 made of a non-conducting material, and a circuit board 102, which is fixed in place therein and carries electronic components, of which only an integrated circuit 112 having an open-circuited input 104 is shown here for reasons of clarity.

To perform the test, control unit 100 was placed on a horizontal metal plate 154 of testing device 500, the metal plate having an electrical connection to ground potential 156. Via a cable tree 158, the control unit is electrically connected to a load simulator 160, which simulates a load to be controlled by control unit 100 during an actual operation and includes an electrical connection 161 of an internal ground potential of control unit 100 to grounded metal plate 154. An ESD gun 150, which is part of test device 500 and used to generate electrostatic discharges at a tip 151 of gun 150, is likewise connected to grounded metal plate 154, via a flexible line 152. As illustrated, tip 151 of the ESD gun is placed on housing 101 of control unit 100 while control unit 100 is running, and an air discharge is applied using a high electrical voltage in relation to zero potential 156, whereupon a check takes place to determine whether a malfunction of control unit 100 occurs. The air discharge briefly causes the formation of an electric field 162, which extends from tip 151 of the ESD gun, through the wall of housing 101, as far as circuit board 102 near open-circuited input 104 of integrated circuit 112. Electric field 162 affects the voltage level at open-circuited input 104, so that a malfunction of control unit 100 occurs.

One strategy for improving the construction of a control unit if such a test method detects malfunctions due to electrostatic discharges consists of enlarging the clearance between the housing wall and the affected circuit component. However, this entails considerable outlay since dies and other production tools must be adapted, and it has the disadvantage of resulting in a larger housing volume.

Another approach consists of increasing the volume conductivity of the housing material through the introduction of electrically conductive materials, which, however, requires a new construction of the housing and entails correspondingly higher costs. Applying a conductive layer on the housing interior likewise causes considerable outlay, since it necessitates additional work steps to apply and contact the layer. Even more involved is the installation of conductive shield surfaces or special encapsulations around the affected circuit components in the control unit.

Therefore, it is desirable to improve the compatibility of a control unit with regard to electrostatic discharges at low cost, in particular as far as constructive modifications are concerned.

SUMMARY

A control unit is therefore provided, especially for a motor vehicle, which control unit includes a circuit board, a high-impedance circuit component situated on the circuit board and having an impedance of 1 kΩ or higher in relation to ground of the control unit; it also includes at least one conductive protection element, which is electrically connected to ground and disposed adjacent to the high-impedance circuit component on the circuit board and has a height inside a protective distance from the high-impedance circuit component that at least equals the protective distance. The spatial terms such as "on", "adjacent to", and "height" relate to the particular surface of the circuit board that carries the high-impedance circuit component.

Under further aspects, the present invention provides a method for designing a circuit board of a control unit, and a computer program product for implementing the method according to which a position of a high-impedance circuit component having an impedance of 1 kΩ or higher in relation to ground of the control unit first is specified on the circuit board. In a further method step, a position, adjacent to the high-impedance circuit component on the circuit board, of at least one conductive protection element electrically connected to ground is specified in such a way that the protection element has a height within a protective distance from the high-impedance circuit component, that at least equals the protective distance.

The present invention is based on the idea of placing a conductive protection element, which is connected to ground, in close proximity to the high-impedance circuit component on the circuit board such that the characteristic of an electric field produced by an electrostatic discharge outside the control unit is deflected toward the protection element. The height of the protection element, which equals or exceeds the distance between the protection element and the high-impedance circuit component, is such that if an electrostatic discharge occurs outside the control unit above the position of the high-impedance circuit component on the circuit board, the path length from the discharge location to the protection element roughly equals or is less than the path length from the discharge location to the high-impedance circuit component. Since the protection element is connected to ground, whereas the high-impedance circuit component is separated from ground by at least 1 kΩ, an electric field is generated whose field lines run between the discharge location and the upper end of the protection element, whereas the space around the high-impedance circuit component remains essentially free of field lines.

In contrast to conventional shield surfaces and encapsulations, for example, the protection element in the present invention is situated only next to the high-impedance circuit component on the circuit board, which makes it possible to achieve better protection of the high-impedance circuit component without any great outlay. Since it suffices if the protection element has no more than the indicated height, the protection element is able to be developed with small width dimensions, so that it is able to be produced in an uncomplicated and cost-effective manner, takes up little space on the circuit board and is able to be integrated into existing circuit-board layouts retroactively without significant modifications. Additional modifications, such as on a housing of the control unit, are not required.

According to one exemplary preferred further development, the control unit has a housing featuring an essentially non-conductive material, e.g., having a conductivity of less than 1 mS. A great variety of such materials is known, e.g., plastics, so that especially cost-effective and/or light-weight materials are able to be used.

According to one exemplary preferred further development, the high-impedance circuit component includes an oscillator, a sensor, an input of an analog-digital converter, and/or an open-circuited terminal of an integrated circuit, such as a programming or test input. As a rule, such circuit components are particularly sensitive to electrostatic discharges, so that a maximum protective effect is able to be achieved.

According to one exemplary preferred further development, a base area of the high-impedance circuit component on the circuit board essentially lies within the protective distance around a section of the circuit board above which the protection element features the height. In this way the entire high-impedance circuit component reliably falls into the area protected by the protection element, even if the high-impedance circuit components have large surfaces, since for each point of the base area, there is a point of the at least one protection element that has greater height than the distance between both points.

According to one exemplary preferred further development, the high-impedance circuit component essentially lies within a protective space around the at least one protection element; this space is able to be formed by superimposing a multitude of right circular cones, each having an opening angle of 90°, an apex on the at least one protection element, and a basic circular plane on the circuit board. This ensures that the entire high-impedance circuit component reliably falls into the area protected by the protection element, especially if high-impedance circuit components that have considerable height above the circuit board are involved, since for each point on a surface of the high-impedance circuit component, there is a point of the at least one protection element that has greater height than the distance between both points.

According to one exemplary preferred further refinement, the at least one protection element is essentially developed in the form of a rod or plate which projects perpendicularly from the circuit board. This requires especially little space and material.

According to one exemplary preferred further refinement, the at least one protection element includes a pressfit pin, which is retained in an opening of the circuit board. Such pins, also known as pressfit pins, are available in standard dimensions as high-volume production goods in cost-effective manner and are able to be fixed in place in an especially uncomplicated manner by simply pressing them into an opening of the circuit board, which simultaneously and without additional steps allows the electrical ground contact to be established, provided a suitable circuit track is available. In addition, the pressfit pin preferably is also used for fixing the circuit board in place in the control unit, for instance in that the pressfit pin, in engagement with a housing lid, serves as hold-down clamp for the circuit board. The dual function of the pressfit pin further reduces the constructive expenditure, since, for instance, a pressfit pin provided at a different location on the circuit board may be dispensed with, so that the inventive measure requires neither additional components nor space on the circuit board.

According to one exemplary preferred further refinement, the at least one protection element is developed as circuit component which includes at least one terminal connected to ground. For example, the protection element may be developed as capacitor, transistor or diode. In this way it is possible, for instance, to additionally use a circuit element, which is required in the electronics of the control unit as it is, as protection element, so that neither another protection element nor more circuit board space is required.

Exemplary embodiments of the present invention will be described in the following with reference to the accompanying drawings.

BRIEF DESCRIPTION OF THE DRAWINGS

In the figures, like or functionally equivalent components are denoted by the same reference numerals, provided that nothing is indicated to the contrary.

DETAILED DESCRIPTION

Figure 1:
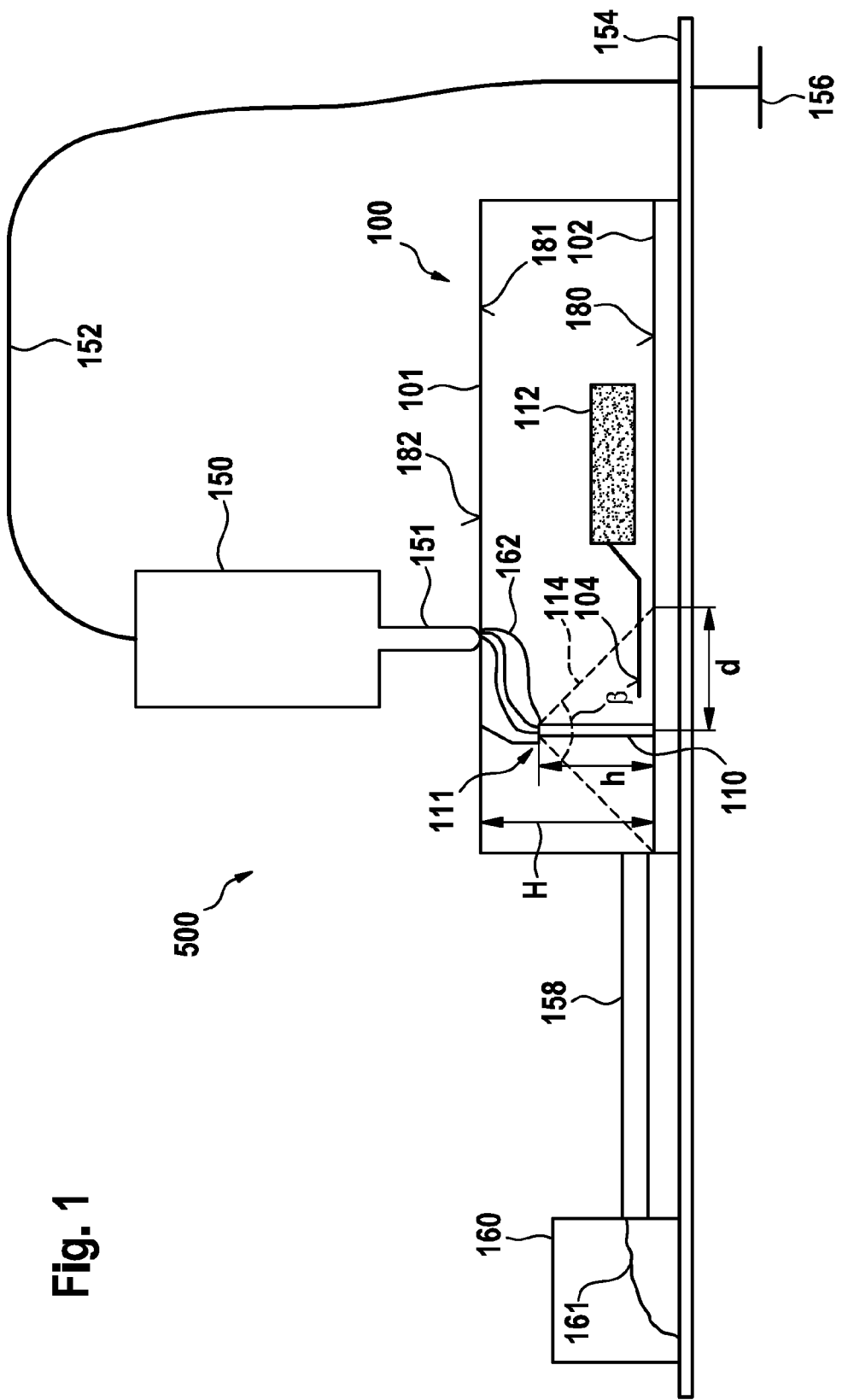
FIG. 1 shows a cross-sectional view of a control unit for a motor vehicle according to one exemplary embodiment of the present invention, during testing of the control unit for electromagnetic compatibility.

FIG. 1 shows a cross-sectional view of a control unit 100 for a motor vehicle, mounted on a test device 500, while a test for electromagnetic interference is implemented at electrostatic discharges according to ISO 10605:2008, the test being shown here in simplified form. Test device 500 has the same design as the device shown in FIG. 5.

Figure 5:
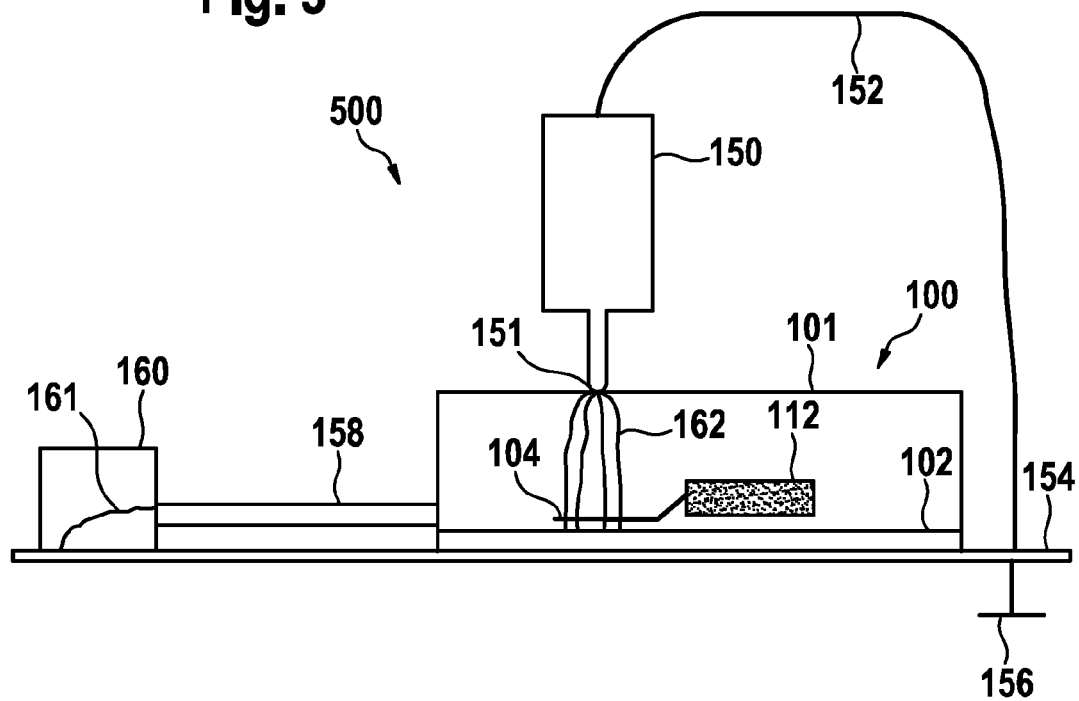
FIG. 5 shows a cross-sectional view of a conventional control unit for a motor vehicle while the control unit is tested for electromagnetic compatibility.

As far as its basic structure is concerned, control unit 100 is identical to the conventional control unit from FIG. 5; however, it additionally has a conductive, rod-shaped protection element 110, which is mounted on circuit board 102 in perpendicular fashion, adjacent to open-circuited input 104, and projects up to a height h beyond surface 180 of circuit board 102. Height h of the protection element is approximately ⅔ of height H of a lid inside 181 of housing 101, when measured from top side 180 of the circuit board. Protection element 110 is electrically connected to ground of control unit 100, e.g., via a suitably routed, but not illustrated, circuit track at the bottom and/or top side 180 of circuit board 102.

During the test illustrated in FIG. 1, which is performed in the same way as in FIG. 5, tip 151 of the ESD gun is placed on housing 101 of control unit 100 while control unit 100 is running; then, an air discharge is applied using a high electric voltage in relation to ground potential 156, and a check takes place to determine whether a malfunction of control unit 100 has occurred. The air discharge briefly causes the formation of an electric field 162, whose field lines extend from tip 151 of the ESD gun through the wall of housing 101, and further along the side, until highest point 111 of protection element 110 is reached. Although tip 151 of ESD gun 150 was placed on housing 101 directly above open-circuited input 104 of integrated circuit 112, as shown in FIG. 5, the region around open-circuited input 104 thus remains essentially field-free, so that the voltage level of open-circuited input 104 is not affected and an interference-free operation of control unit 100 is made possible.

Dashed lines in FIG. 1 mark a protection area 114 around protection element 110, into which the protective effect of protection element 110 extends, the protective effect consisting of keeping electric fields away from high-resistance circuit components. Protection area 114 has the form of a circular cone, which widens in the downward direction and has an opening angle $\beta=90°$, whose cone apex coincides with highest point 111 of protection element 110 and whose basic circular plane coincides with top side 180 of circuit board 102. The cone axis of the circular cone coincides with the central axis of rod-shaped protection element 110, and radius d of the base circle on circuit board 102 is equal to height h of protection element 110. An essential section of open-circuited input 104 lies within protection area 114. When examining the projections of open-circuited input 104 and of highest point 111 of protection element 110 onto circuit board 102, the distance between both amounts to less than height h.

Figure 2:
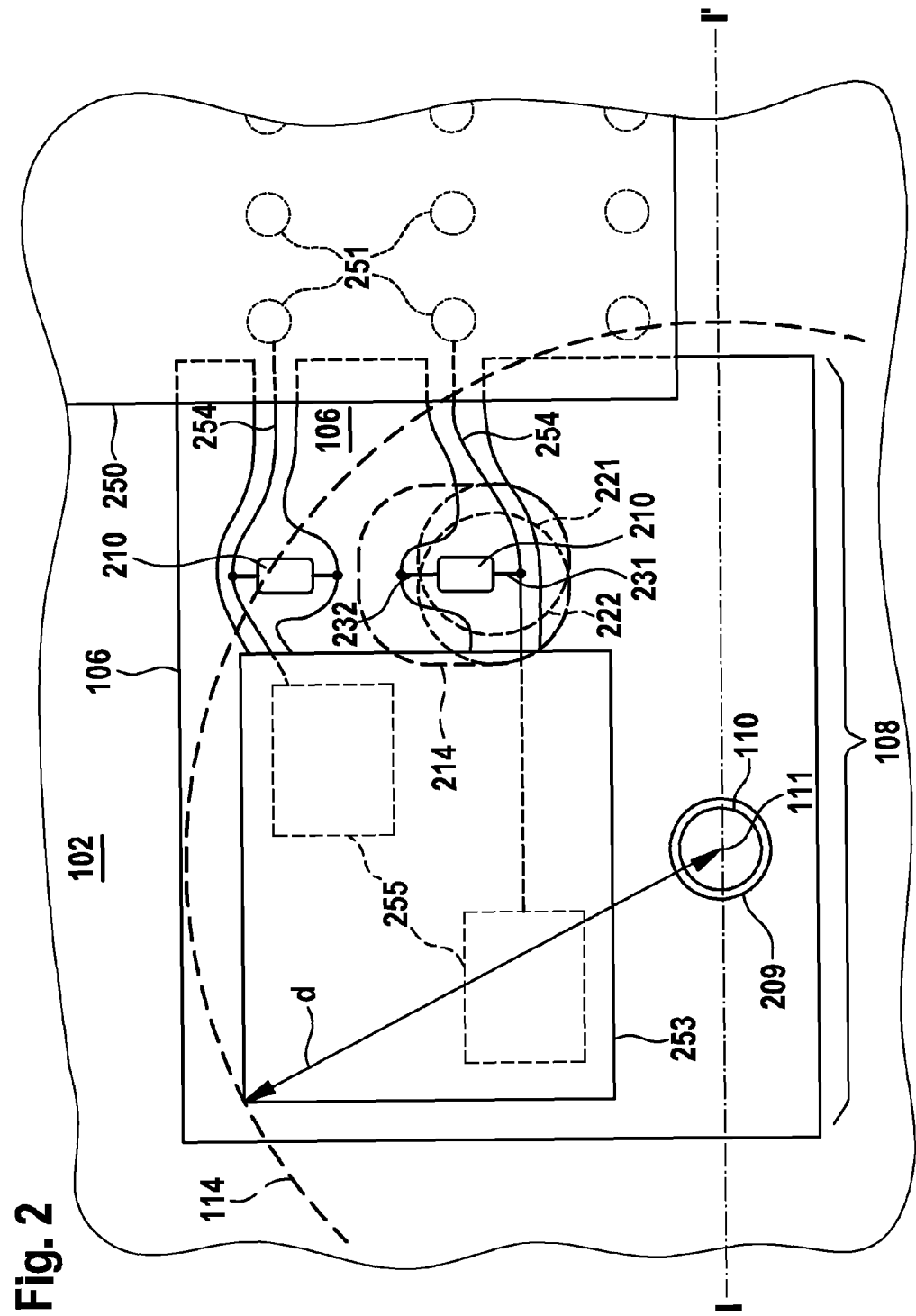
FIG. 2 shows a cut-away plan view of a circuit board of a control unit according to another exemplary development.
Figure 3:
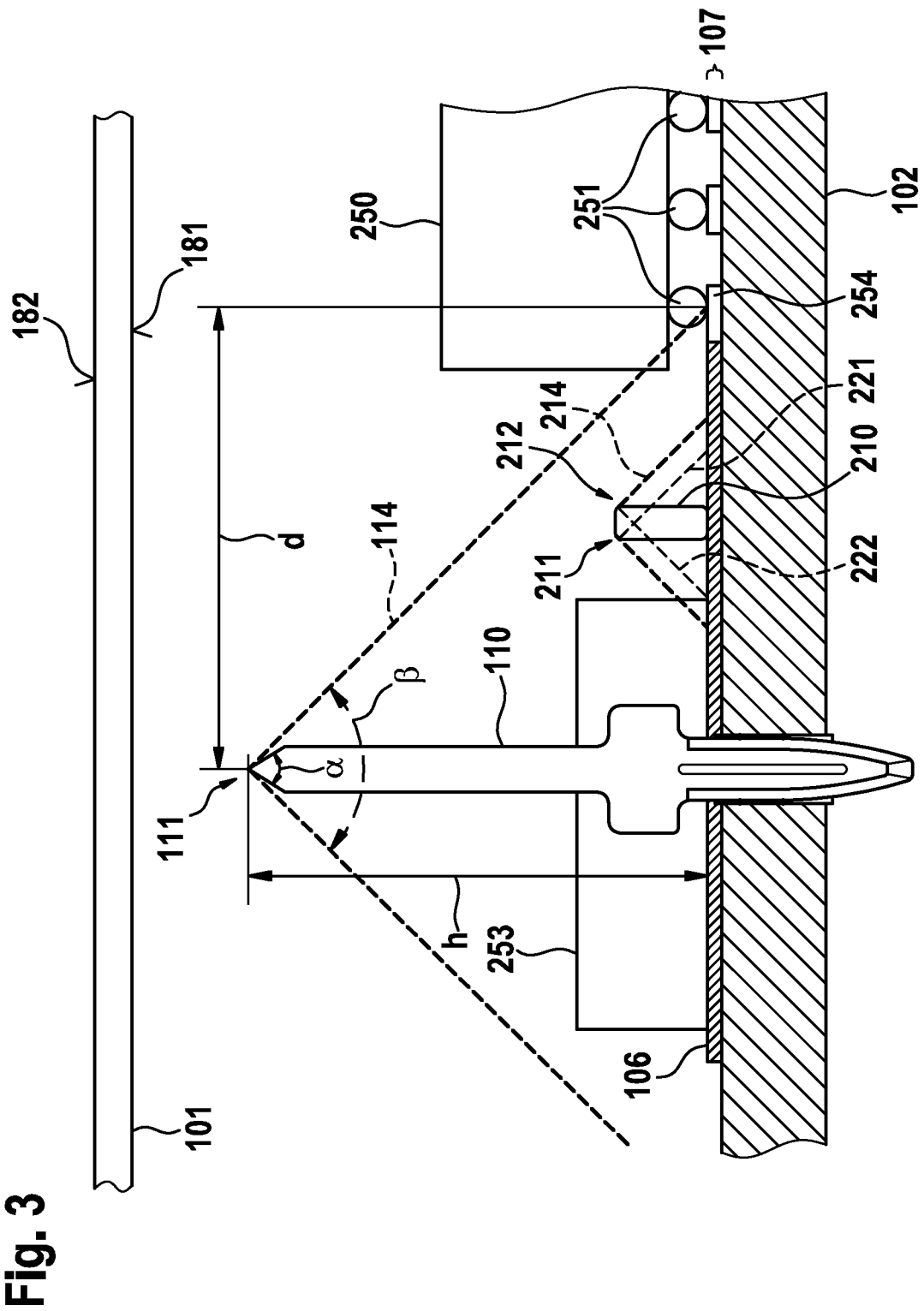
FIG. 3 shows a cut-away cross-sectional view of the circuit board from FIG. 2, along line I-I'.

FIGS. 2 and 3 show a cut-away portion of a circuit board 102 of a control unit for a motor vehicle according to another exemplary embodiment. A metallization layer 107, in which different circuit tracks 254, 106 have been produced by means of an etching process or by some other suitable method, is situated on circuit board 102.

A quartz oscillator 253 is mounted within a rectangular shield region 108 of circuit board 102, inside which it is largely covered by a ground circuit track 106 formed out of metalization layer 107. Additional circuit tracks 254, which are isolated from ground circuit track 106, run through shield region 108, from connection contacts 255 at the underside of quartz oscillator 253 and out of shield region 108, where they are contacted by soldering globules 251 of a soldering globule matrix, which is used for mounting a microcontroller 250 on circuit board 102. Mounted between quartz oscillator 253 and microcontroller 250 on the circuit board are two capacitors 210, which include a terminal 232 connected to ground circuit track 106, and another terminal 231, which is connected to one of circuit tracks 254 that connect microcontroller 250 to quartz oscillator 253, and is isolated from ground 106.

Formed next to quartz oscillator 253, which constitutes a high-resistance circuit component, i.e., a circuit component having an impedance of 1 kΩ or higher in relation to ground 106, is a bore hole 209 extending through the circuit board inside shield area 108. A metallic pressfit pin 110, forming a protection element for quartz oscillator 253, is pressed into bore hole 209 in order to protect it from the effects of electrical fields generated by electrostatic discharges outside the control unit. Pressfit pin 110 is electrically connected to ground in that it contacts ground circuit track 106 surrounding pressfit hole 209 and/or a hole face metallization layer (not shown here) that may possibly be formed in the hole face in addition, which metalization layer is electrically connected to ground circuit track 106. Pressfit pin 110 has a height h of 3.5 mm, for instance, and includes at its upper end a conical tip 111, which has an opening angle $\alpha$ of approximately 30° to 60°.

A dashed line marks a protection area 114 in the shape of a circular cone around pressfit pin 110, as already elucidated with reference to FIG. 1. Quartz oscillator 253 lies completely within this protection area 114. FIG. 2, in particular, illustrates that the base area of quartz oscillator 253 on circuit board 102 lies within the base circle of protection area 114 in the shape of a circular cone.

If electrostatic discharges occur on outside 182 of a non-conductive housing wall 101 that extends above circuit board 102, quartz oscillator 253 thus is protected from malfunctions caused by electrical fields.

Since the two capacitors 210 have a terminal 232 connected to ground 106 in each case, they likewise act as protection elements. Protection region 214 formed by an irregularly shaped protection element, such as one of capacitors 210, is able to be obtained by constructing a circular cone for each point at the surface of individual capacitor 210, which cone is open in the downward direction and has its cone apex at the particular point. Overlapping the multitude of circular cones 221, 222 created in this manner (shown here as representative for two upper corners 211, 212 of the approximated block shape of capacitor 210) results in protection region 214 of the irregularly shaped protection element, in this case, of capacitor 210. However, since this region lies completely within protection region 114 of pressfit pin 110 in the example shown in FIGS. 2 and 3, based on one of capacitors 210, the entire protection region protected by pressfit pin 110 and said capacitor 210 is identical to protection region 114 of pressfit pin 110 on its own.

Figure 4:
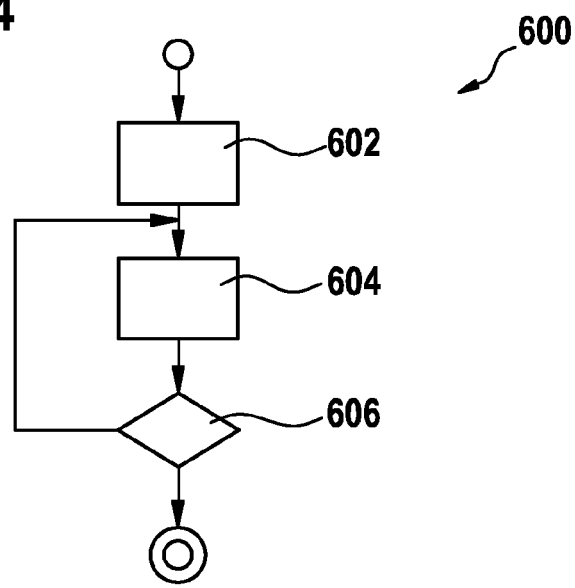
FIG. 4 shows a flow chart of a method for designing a circuit board of a control unit according to one exemplary embodiment.

FIG. 4 shows a flow chart of a method 600 for designing a circuit board of a control unit. In step 602, a position of a high-resistance circuit component having an impedance of 1 kΩ or higher in relation to ground of the control unit is specified to begin with. In a further method step 604, a position, adjacent to the high-impedance circuit component on the circuit board, of a conductive protection element, which is electrically connected to ground and has a given height h, is specified in such a way that, if possible, a large section of the high-impedance circuit component lies within a circular protection region around the protection element, whose radius is equal to the height of the protection element.

In decision step 606, it is checked whether the protection region already covers the entire high-impedance circuit component. If this is not the case, the method returns to step 604, in which the position of an additional, similar protection element is now specified in such a way that, if possible, a large section of the high-impedance circuit component lies within the overall protection region formed by the overlap of the individual, circular protection regions around the individual protection element. In decision step 606, a check then takes place as to whether the total protection region already covers the entire high-impedance circuit component. If this is not the case, the method returns to step 604.

If it is determined in decision step 606 that the protection region of the protection elements currently in place covers the high-impedance circuit component completely, the method ends.

What is claimed is:

1. A control unit, comprising:
   a circuit board;
   a high-impedance circuit component situated on the circuit board and having an impedance of 1 kΩ or higher in relation to ground of the control unit; and
   at least one conductive protection element:
      that is electrically connected to ground;
      that is situated, adjacent to the high-impedance circuit component on the circuit board, to, within a protective distance from the at least one conductive protection element, deflect electric field components produced outside the control unit away from the high-impedance circuit component; and
      a height of which is at least equal in length to the protective distance.

2. The control unit according to claim 1, further comprising:
   a housing made of an essentially non-conductive material.

3. The control unit according to claim 2, wherein a conductivity of the housing is less than 1 mS.

4. The control unit according to claim 1, wherein the high-impedance circuit component includes at least one of an oscillator, a sensor, an input of an analog-digital converter and an open-circuited connection terminal of an integrated circuit.

5. The control unit according to claim 1, wherein a base area of the high-impedance circuit component on the circuit board essentially lies inside the protective distance about a section of the circuit board above which the at least one protection element has the height.

6. The control unit according to claim 5, wherein the high-impedance circuit component essentially lies within a protection region around the at least one protection element, the protection region being formed by superimposing a multitude of right circular cones, each having an opening angle of 90°, a cone apex on the at least one protection element, and a base circular plane on the circuit board.

7. The control unit according to claim 1, wherein the at least one protection element is developed essentially in a shape of a rod or plate projecting perpendicularly from the circuit board.

8. The control unit according to claim 1, wherein the at least one protection element includes a pressfit pin which is retained in an opening of the circuit board and fixates the circuit board in the control unit.

9. The control unit according to claim 8, wherein the pressfit pin fixes the circuit board in place in the control unit.

10. The control unit according to claim 1, wherein the at least one protection element includes a circuit component which is connected to ground at at least one connection terminal.

11. The control unit according to claim 10, wherein the at least one protection element is a capacitor, a transistor, or a diode.

12. The control unit according to claim 1, wherein the arrangement of the at least one conductive protection element is such that the electric field components produced outside the control unit are deflected towards the at least one conductive element, away from the high-impedance circuit component.

13. The control unit according to claim 12, wherein the electric field components that are deflected are ones produced by an electrostatic discharge occurring outside the control unit and above the high-impedance circuit component.

14. The control unit according to claim 13, wherein the electric field components are field lines of an electric field produced by the electrostatic discharge.

15. A computer-implemented method for designing a circuit board of a control unit, comprising:
   specifying, by a computer processor, a position of a high-impedance circuit component, which has an impedance of 1 kΩ or higher in relation to ground of the control unit, on the circuit board;
   specifying, by the processor, a position, adjacent to the high-impedance circuit component on the circuit board, of at least one conductive protection element electrically connected to ground, such that the at least one protection element, within a protective distance from the at least one protection element, deflects electric field components produced outside the control unit away from the high-impedance circuit component;
   wherein a height of the at least one protection element is at least equal in length to the protective distance.

16. A non-transitory computer readable storage device storing a computer program that is executable by a computer processor, the program which, when executed by the processor, causes the processor to perform a method for designing a circuit board of a control unit, the method comprising:
   specifying a position of a high-impedance circuit component, which has an impedance of 1 kΩ or higher in relation to ground of the control unit, on the circuit board;
   specifying a position, adjacent to the high-impedance circuit component on the circuit board, of at least one conductive protection element electrically connected to ground, such that the at least one protection element, within a protective distance from the at least one protection element, deflects electric field components produced outside the control unit away from the high-impedance circuit component;
   wherein a height of the at least one protection element is at least equal in length to the protective distance.

* * * * *